United States Patent
Tsurunari et al.

(10) Patent No.: US 9,203,376 B2
(45) Date of Patent: Dec. 1, 2015

(54) LADDER-TYPE SURFACE ACOUSTIC WAVE FILTER AND DUPLEXER INCLUDING THE SAME

(71) Applicant: SKYWORKS PANASONIC FILTER SOLUTIONS JAPAN CO., LTD., Kadoma-Shi, Osaka (JP)

(72) Inventors: Tetsuya Tsurunari, Osaka (JP); Joji Fujiwara, Osaka (JP); Hiroyuki Nakamura, Osaka (JP); Hidekazu Nakanishi, Osaka (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 275 days.

(21) Appl. No.: 13/774,811

(22) Filed: Feb. 22, 2013

(65) Prior Publication Data

US 2013/0162368 A1 Jun. 27, 2013

Related U.S. Application Data

(63) Continuation of application No. PCT/JP2012/004030, filed on Jun. 21, 2012.

(30) Foreign Application Priority Data

Jun. 23, 2011 (JP) .................. 2011-139080

(51) Int. Cl.
*H03H 9/72* (2006.01)
*H03H 9/64* (2006.01)
*H03H 9/02* (2006.01)

(52) U.S. Cl.
CPC .............. *H03H 9/64* (2013.01); *H03H 9/0222* (2013.01); *H03H 9/6483* (2013.01); *H03H 9/725* (2013.01)

(58) Field of Classification Search
CPC ... H03H 9/02834; H03H 9/64; H03H 9/6483; H03H 9/725
USPC ........... 333/193–196, 133; 310/313 B, 313 D
See application file for complete search history.

(56) References Cited

U.S. PATENT DOCUMENTS 5,726,610 A * 3/1998 Allen et al. .................... 333/133
6,201,457 B1 * 3/2001 Hickernell .................... 333/193

(Continued)

FOREIGN PATENT DOCUMENTS

JP 2000-068784 * 3/2000
JP 2000-196409 A 7/2000

(Continued)

OTHER PUBLICATIONS

R. Takayama et al.; "US-PCS SAW Duplexer Using High-Q SAW Resonator With SiO2 Coat for Stabilizing Temperature Characteristics"; 2004 IEEE International Ultrasonics, Ferroelectrics, and Frequency Control Joint 50th Anniversary Conference Aug. 23-27, 2004, vol. 2, pp. 959-962 and one IEEE Xplore abstract page.*

(Continued)

*Primary Examiner* — Barbara Summons
(74) *Attorney, Agent, or Firm* — Lando & Anastasi, LLP (57) ABSTRACT

A ladder-type surface acoustic wave filter includes a first series resonator having the lowest resonance frequency among a plurality of series resonators; and a second series resonator having a resonance frequency higher than the first series resonator. The film thickness of a dielectric film in the region where the first series resonator is formed is larger than that of a dielectric film in the region where the second series resonator is formed.

23 Claims, 5 Drawing Sheets

(56) References Cited

U.S. PATENT DOCUMENTS

| | | | |
|---|---|---|---|
| 6,570,470 B2 * | 5/2003 | Maehara et al. | 333/193 |
| 6,717,487 B2 * | 4/2004 | Takata | 333/133 |
| 6,975,185 B2 * | 12/2005 | Tsutsumi et al. | 333/193 |
| 7,327,205 B2 * | 2/2008 | Taniguchi | 333/133 |
| 7,456,705 B2 * | 11/2008 | Ito | 333/133 |
| 7,498,898 B2 * | 3/2009 | Nakanishi et al. | 333/133 |
| 8,072,293 B2 * | 12/2011 | Nakamura et al. | 333/133 |
| 2005/0025324 A1 | 2/2005 | Takata | |
| 2007/0241841 A1 * | 10/2007 | Hauser et al. | 333/193 |
| 2008/0074212 A1 | 3/2008 | Matsuda et al. | |
| 2008/0246557 A1 * | 10/2008 | Kiwitt et al. | 333/133 |
| 2009/0115554 A1 * | 5/2009 | Takayama et al. | 333/195 |
| 2010/0207707 A1 * | 8/2010 | Yata | 333/195 |
| 2012/0019102 A1 * | 1/2012 | Seki et al. | 310/313 C |
| 2012/0086521 A1 | 4/2012 | Tsurunari et al. | |
| 2012/0139662 A1 | 6/2012 | Fujiwara et al. | |

FOREIGN PATENT DOCUMENTS

| | | | |
|---|---|---|---|
| JP | 2002-232264 | * | 8/2002 |
| JP | 2004-007094 A | | 1/2004 |
| JP | 2005-045475 A | | 2/2005 |
| JP | 2008-079227 A | | 4/2008 |
| WO | WO-2010/146826 A1 | | 12/2010 |
| WO | WO-2011/052218 A1 | | 5/2011 |

OTHER PUBLICATIONS

English language machine translation of JP 2000-068784 published Mar. 3, 2000, 7 pages.*

English language machine translation of JP 2002-232264 published Aug. 16, 2002, 7 pages.*

International Search Report mailed Aug. 14, 2012 issued in corresponding International Application No. PCT/JP2012/004030.

* cited by examiner

LADDER-TYPE SURFACE ACOUSTIC WAVE FILTER AND DUPLEXER INCLUDING THE SAME

RELATED APPLICATIONS

This application is the Continuation of International Application No. PCT/JP2012/004030, filed on Jun. 21, 2012, which in turn claims the benefit of Japanese Application No. 2011-139080, filed on Jun. 23, 2011, the disclosures of which Applications are incorporated by reference herein.

TECHNICAL FIELD

The present disclosure relates to a ladder-type surface acoustic wave filter and a duplexer including the filter.

BACKGROUND

Figure 10:
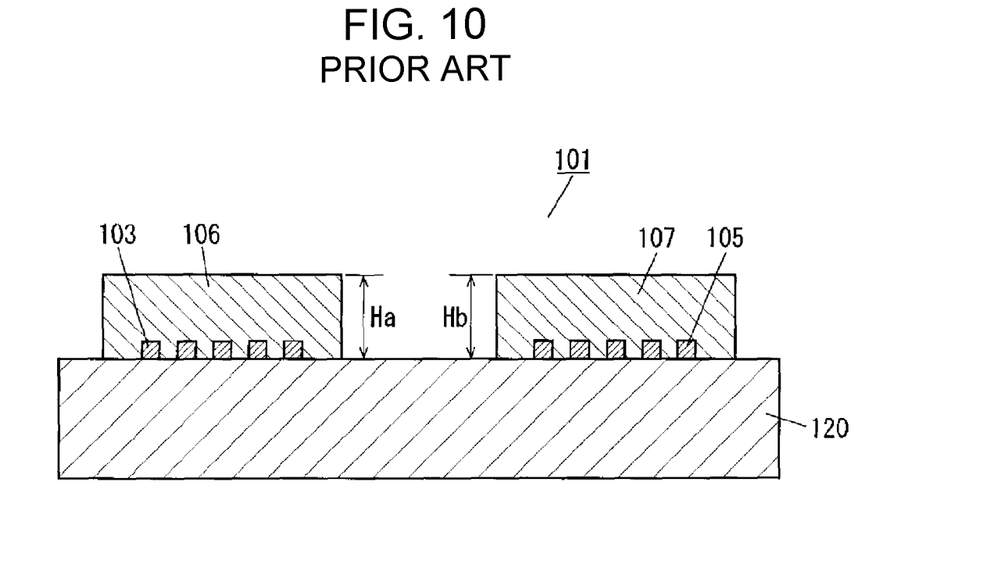
FIG. 10 is a schematic sectional view of a conventional ladder-type surface acoustic wave filter.

As shown in FIG. 10, a ladder-type surface acoustic wave filter 101 includes piezoelectric substrate 120; first series resonator 103 which is one of series resonators formed on piezoelectric substrate 120 and has the lowest resonance frequency among the series resonators; and dielectric film 106 formed on piezoelectric substrate 120 so as to cover resonator 103. Filter 101 further includes second series resonator 105 formed on piezoelectric substrate 120 and having a resonance frequency higher than that of resonator 103; and dielectric film 107 formed on piezoelectric substrate 120 so as to cover resonator 105.

In this configuration, film thickness Ha of dielectric film 106 is equal to film thickness Hb of dielectric film 107.

SUMMARY

In one general aspect, the instant application describes a ladder-type surface acoustic wave filter comprising a substrate; an input terminal; an output terminal; a ground terminal; a plurality of series resonators formed on the substrate and connected between the input terminal and the output terminal; a parallel resonator formed on the substrate and connected between the series resonators and the ground terminal; and a dielectric film coupled to at least one of the plurality of series resonators and having an inverse temperature coefficient of frequency to that of the substrate. The plurality of series resonators include a first series resonator and a second series resonator, the first series resonator having a lowest resonance frequency among the plurality of series resonators. The dielectric film is formed in a region where the first series resonator is formed. The dielectric film is not formed in a region where the second series resonator is formed or if the dielectric film is formed in the region where the second series resonator is formed, a film thickness of the dielectric film in the region where the second series resonator is formed is smaller than a film thickness of the dielectric film in the region where the first series resonator is formed.

The above general aspect may include one or more of the following features. The dielectric film may be made of silicon oxide. An antiresonant frequency of the first series resonator may be lower than an antiresonant frequency of the second series resonator. A capacitance of the first series resonator may be larger than a capacitance of the second series resonator. The first series resonator may have more interdigital transducer electrode fingers than the second series resonator. The first series resonator may be connected to a second or a subsequent stage from the input terminal.

The film thickness of the dielectric film in the region where the first series resonator is formed may be larger than the film thickness of the dielectric film in other regions on the substrate. The first series resonator may be disposed closer to the output terminal than to the input terminal. The first series resonator may be disposed closest to the output terminal among the plurality of series resonators. The first series resonator may have a smallest duty among the plurality of series resonators. The substrate may include a piezoelectric substrate.

In a second general aspect, the instant application describes a ladder-type surface acoustic wave filter comprising a substrate; an input terminal; an output terminal; a ground terminal; a plurality of series resonators formed on the substrate and connected between the input terminal and the output terminal; a parallel resonator formed on the substrate and connected between the series resonators and the ground terminal; and a dielectric film coupled to the series resonators and having an inverse temperature coefficient of frequency to that of the substrate. The plurality of series resonators include a first series resonator and a second series resonator, the first series resonator having a lowest resonance frequency among the plurality of series resonators. A duty of the first series resonator is smaller than a duty of the second series resonator.

The above second general aspect may include one or more of the following features. A capacitance of the first series resonator may be larger than a capacitance of the second series resonator. An antiresonant frequency of the first series resonator may be lower than an antiresonant frequency of the second series resonator. The first series resonator may be connected to a second or a subsequent stage from the input terminal. The substrate may include a piezoelectric substrate.

In a third general aspect, the instant application describes a ladder-type surface acoustic wave filter comprising a substrate; an input terminal; an output terminal; a ground terminal; a plurality of series resonators formed on the substrate and connected between the input terminal and the output terminal; and a parallel resonator formed on the substrate and connected between the series resonators and the ground terminal. The plurality of series resonators include a first series resonator and a second series resonator, the first series resonator having a lowest resonance frequency among the plurality of series resonators. A temperature coefficient of frequency of a characteristics of the first series resonator is smaller than that of the second series resonator.

The above third general aspect may include the following feature. The substrate may include a piezoelectric substrate.

In fourth general aspect, the instant application describes a duplexer comprising the ladder-type surface acoustic wave filter according to the first general aspect; and a second filter. A passband of the second filter is higher than that of the ladder-type surface acoustic wave filter.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high level, without detail, in order to avoid unnecessarily obscuring aspects of the present teachings.

Referring again to FIG. 10, first series resonator 103 has the lowest resonance frequency among the series resonators. Thus, the first series resonator 103 may consume more power second series resonator 105 around the cutoff frequency at the high-frequency side of the filter 101. Accordingly, first series resonator 103 may produce more heat. Thus, frequency fluctuations in the characteristics resulting from the temperature coefficient of frequency (TCF) of first series resonator 103 may become larger than that of second series resonator 105, which undesirably degrades the pass characteristics of filter 101.

Hereinafter, a ladder-type surface acoustic wave filters of the present disclosure are described.

First Exemplary Embodiment

Figure 1:
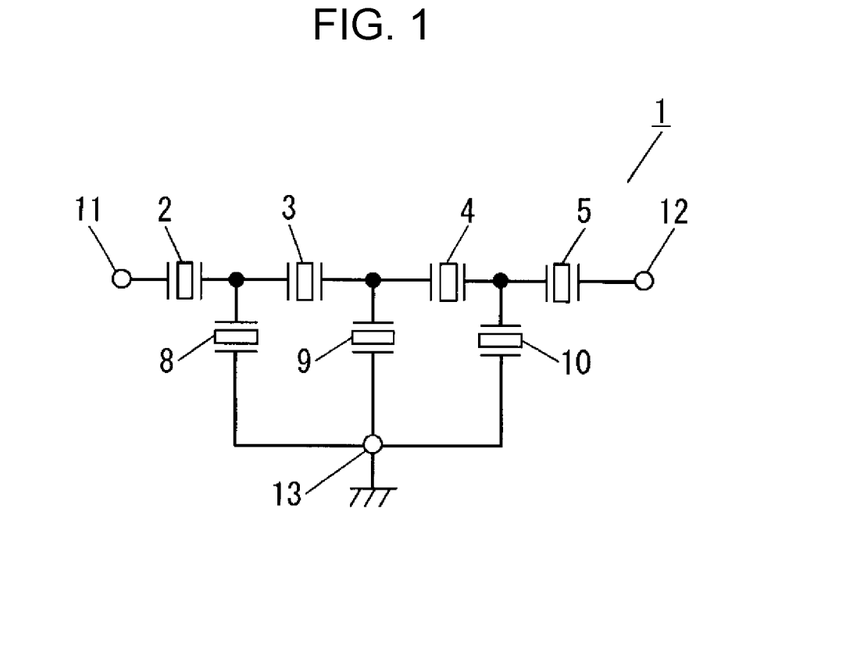
FIG. 1 is a circuit block diagram of a ladder-type surface acoustic wave filter according to first and second exemplary embodiments of the present disclosure.

FIG. 1 is a circuit block diagram of an embodiment of filter 1 according the first embodiment. In FIG. 1, filter 1 includes series resonators 2-5 connected in series between input terminal 11 and output terminal 12. Filter 1 further includes parallel resonators 8-10. Parallel resonator 8 at one side is connected to series resonators 2 and 3 and at another side is connected to ground terminal 13. Parallel resonator 9 at one side is connected to series resonators 3 and 4 and at another side is connected to ground terminal 13. Parallel resonator 10 at one side is connected to series resonators 4 and 5 and at another side is connected to ground terminal 13.

Table 1 describes characteristics of series resonators 2-5. The characteristics include (1) the number of dividing a resonator (the number of stages), (2) the pitch of electrode fingers of an interdigital transducer (IDT) (the pitch is assumed to be ½ of wavelength λ of the main acoustic wave), the number of the IDT electrode fingers, (4) the number of reflectors interposing IDTs, (5) the interdigitating width of IDT electrode fingers, and (6) the duty (electrode width/pitch).

TABLE 1

| Series resonator | (1) Stages | (2) Pitch (μm) | (3) IDTs | (4) Reflectors | (5) ID width (μm) | (6) Duty |
| --- | --- | --- | --- | --- | --- | --- |
| 2 | 3 | 0.97 | 374 | 30 | 41 | 0.50 |
| 3 | 2 | 0.99 | 510 | 30 | 49 | 0.50 |
| 4 | 3 | 0.96 | 238 | 30 | 38 | 0.50 |
| 5 | 2 | 0.98 | 282 | 30 | 40 | 0.50 |

Figure 2:
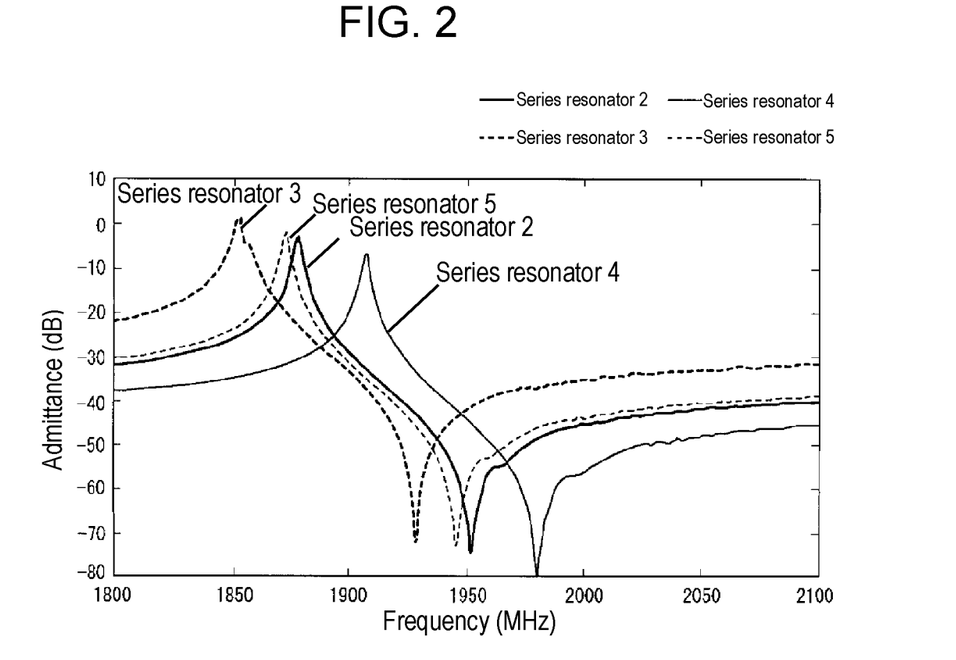
FIG. 2 shows the admittance characteristics of the respective series resonators of the same filter.

FIG. 2 shows the admittance characteristics of series resonators 2-5. In FIG. 2, the vertical axis represents admittance (dB) and the horizontal axis represents frequency (MHz). As shown in FIG. 2, the resonance frequency of series resonator 3 is the lowest among resonance frequencies of series resonators 2-5. The resonance frequency of series resonator 5 is higher than the resonance frequency of series resonator 3 and lower than resonance frequencies of resonators 2 and 4. The resonance frequency of series resonator 2 is higher than the resonance frequency of series resonator 5 and lower than resonance frequency of series resonator 4. The resonance frequency of resonator 4 is the highest among resonance frequencies of series resonators 2-5. In this embodiment, series resonator 3 is the first series resonator, and series resonator 4 is the second series resonator out of resonators 2, 4, and 5. Alternatively, the second series resonator may be resonator 2 or 5 instead of series resonator 4.

Figure 3:
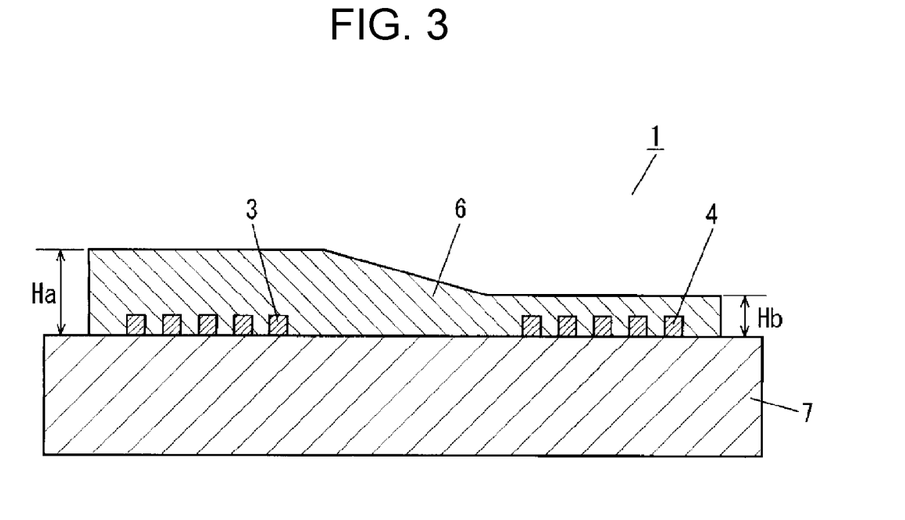
FIG. 3 is a schematic sectional view of the same filter.

FIG. 3 is a schematic sectional view of ladder-type surface acoustic wave filter 1 including first series resonator 3 (having the lowest resonance frequency among resonators 2-5) and second series resonator 4 (having a resonance frequency higher than that of resonator 3). In FIG. 3, filter 1 includes piezoelectric substrate 7, series resonators 2-5 and parallel resonators 8-10 (series resonators 2 and 5 and parallel resonators 8-10 are not shown) formed on piezoelectric substrate 7, and dielectric film 6 attached to at least first series resonator 3 out of series resonators 2-5 and parallel resonators 8-10. The dielectric film 6 may have inverse temperature coefficient of frequency to that of piezoelectric substrate 7. Further, film thickness Ha of dielectric film 6 in the region covering at least first series resonator 3 is larger than film thickness Hb of dielectric film 6 in the region covering at least second series resonator 4. In one implementation, no dielectric film is formed in the region covering at least second series resonator 4 (e.g., the film thickness Hb is zero). The film thickness of dielectric film 6 refers to the distance between the top surface of piezoelectric substrate 7 and the top surface of dielectric film 6 at the region where electrode fingers are not formed between electrode fingers in the region where resonators are formed.

Figure 4:
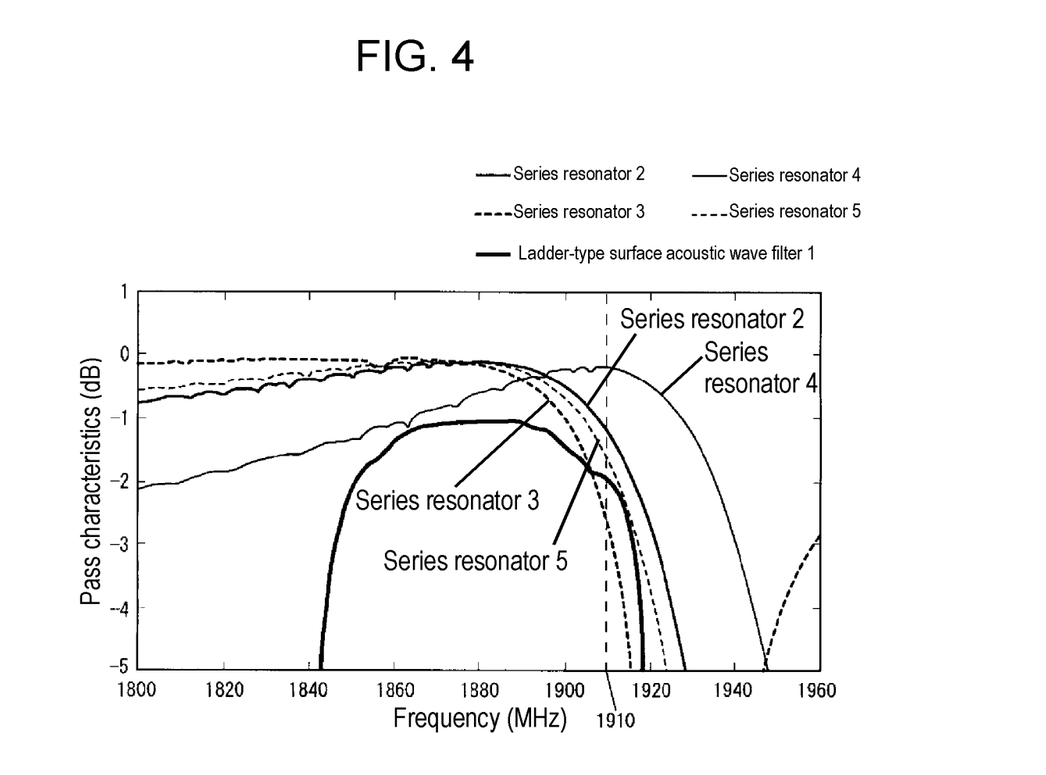
FIG. 4 shows the pass characteristics of the same filter and the series resonators.

FIG. 4 shows the pass characteristics (signal passage loss) of the series resonators and those of ladder-type surface acoustic wave filter 1. As shown in FIG. 4, the passage loss in first series resonator 3 at 1,910 MHz, for instance, is approximately −2.8 dB while that in second series resonator 4 is approximately −0.2 dB. This is because the resonance frequency of first series resonator 3 is lower than that of second series resonator 4, and the impedance of first series resonator 3 is larger than that of second series resonator 4 at 1,910 MHz. Accordingly, first series resonator 3 consumes more power than second series resonator 4 around the cutoff frequency at the high-frequency side of the passband of ladder-type surface acoustic wave filter 1.

Referring again to FIG. 3, because film thickness Ha of dielectric film 6 in the region where first series resonator 3 is formed is larger than film thickness Hb of dielectric film 6 in the region where second series resonator 4 is formed, the temperature coefficient of frequency of the characteristics of first series resonator 3 is smaller than that of second series resonator 4. Consequently, even if first series resonator 3 consumes more power, thereby generating more heat than second series resonator 4, still frequency fluctuations of the characteristics of first series resonator 3 may be reduced. This may prevent deterioration of the pass characteristics of ladder-type surface acoustic wave filter 1.

Hereinafter, each component of ladder-type surface acoustic wave filter 1 of the first embodiment is described in detail.

In this embodiment, piezoelectric substrate 7 is based on lithium niobate (LiNbO₃) with −10°≤φ≤10°, 33°≤θ≤43°, and −10°≤ψ≤10° in the Euler angle (φ, θ, ψ) notation, where φ and θ are cut angles and ψ is a propagation angle of substrate 7. However, substrate 7 may be made of other piezoelectric single-crystal medium such as a substrate or thin film based on crystal, lithium tantalate ($LiTaO_3$), potassium niobate ($KNbO_3$), or lithium niobate ($LiNbO_3$) with another Euler angle.

To use a substrate based on lithium niobate ($LiNbO_3$) within the range of −100°≤θ≤−60° in the Euler angle (φ, θ, ψ) notation for piezoelectric substrate 7, the Euler angle (φ, θ, ψ) of substrate 7 may satisfy −100°≤θ≤−60°, 1.194φ−2°≤ψ≤1.194φ+2°, ψ≤−2φ−3°, as described in WO 2011/052218. This Euler angle may reduce unnecessary spurious emission due to a Rayleigh wave while reducing unnecessary spurious emission around a frequency band where fast transverse waves occur.

Resonators 2-5 and 8-10 are disposed so that one set of comb-shaped IDTs are engaged with each other viewed from above piezoelectric substrate 7 and are provided with reflectors at both ends of the IDTs. In this embodiment, each of resonators 2-5 and 8-10 includes a first electrode layer and a second electrode layer provided on the first electrode layer, in this order from piezoelectric substrate 7. The first layer primarily contains molybdenum with a film thickness of 0.04λ. The second layer primarily contains aluminum with a film thickness of 0.08λ. Resonator 2-5 and 8-10 may be formed of one of the following three types of metals for instance: a single metal such as aluminum, copper, silver, gold, titanium, tungsten, platinum, and chromium; an alloy primarily containing one of these metals; or a lamination of these metals. The resonators may have three- or four-layered electrodes with titanium or titanium nitride placed between piezoelectric substrate 7 and the first electrode layer or between the first electrode layer and the second electrode layer. Such a structure may increase the crystal orientation of the electrodes and may prevent deterioration due to migration.

Figure 5:
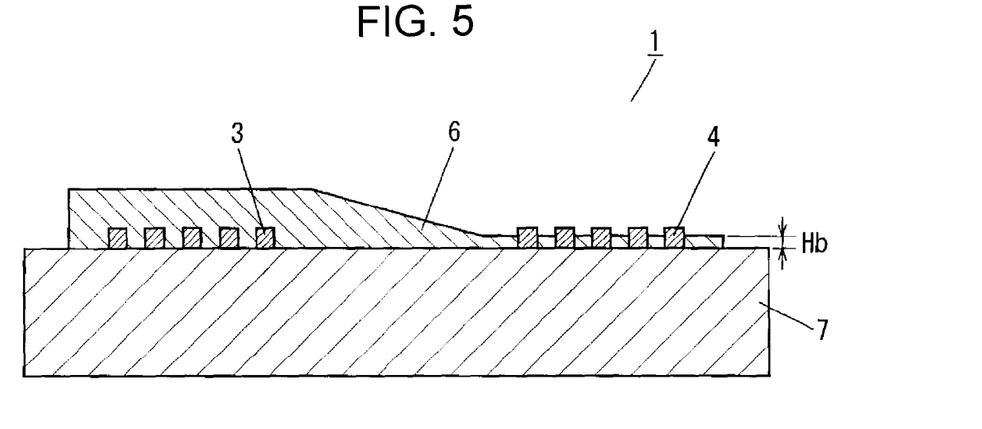
FIG. 5 is a schematic sectional view of the same filter.

Dielectric film 6 is a thin film having inverse temperature coefficient of frequency to that of piezoelectric substrate 7. Dielectric film 6 may be made of silicon oxide ($SiO_2$), for instance. FIG. 3 shows that dielectric film 6 covers the IDT electrode fingers of resonators 3 and 4. Alternatively, the following structure as shown in FIG. 5 may be used. In FIG. 5, dielectric film 6 is provided between the IDT electrode fingers of first series resonator 3 and between those of second series resonator 4. The top surfaces of the IDT electrode fingers of second series resonator 4, however, are exposed from dielectric film 6. Even in such cases, the film thickness of dielectric film 6 in this description refers to distance Ha or Hb between the top surface of piezoelectric substrate 7 and the top surface of dielectric film 6, in the region where electrode fingers are not formed (e.g., between the electrode fingers of a resonator).

Figure 6:
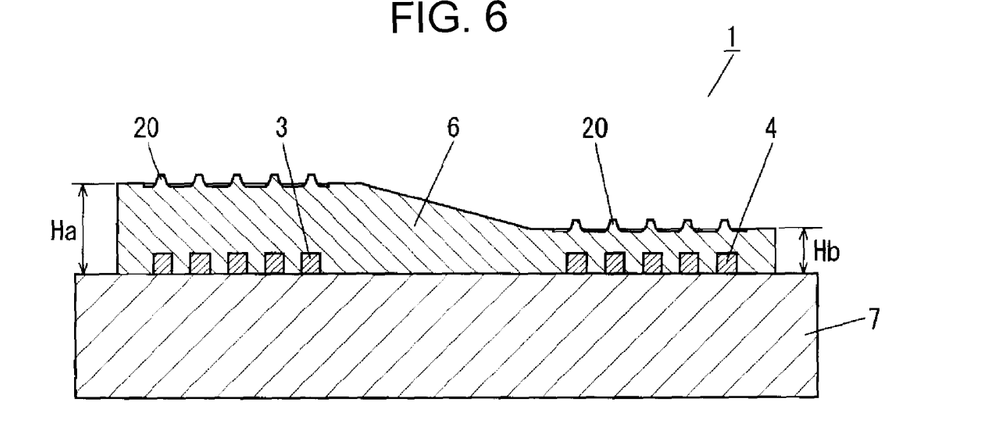
FIG. 6 is a schematic sectional view of the same filter.

FIG. 3 shows that the top surface of dielectric film 6 is flat; however, it may not be flat. For instance, as shown in FIG. 6, the top surface of dielectric film 6 above the IDT electrode fingers of resonators 3 and 4 may be provided thereon with projections 20. In this case as well, the film thickness of dielectric film 6 in this description refers to distance Ha or Hb between the top surface of piezoelectric substrate 7 and the top surface of dielectric film 6, in the region where electrode fingers are not formed (e.g., between the electrode fingers of a resonator).

In a case where piezoelectric substrate 7 is made of lithium niobate ($LiNbO_3$) and dielectric film 6 is made of silicon oxide, film thickness Ha of resonator 4 in the region where resonator 3 is formed may be at least 0.29λ and less than 0.34λ and film thickness Hb of dielectric film 6 in the region where resonators 2, 4, 5, 8, 9, and 10 are formed may be at least 0.24λ and less than 0.29λ, in view of reducing temperature coefficient of frequency and achieving an appropriate electromechanical coupling factor of series resonators 2-5, and parallel resonators 8-10. Meanwhile, film thickness Ha of dielectric film 6 in the region where first series resonator 3 is formed may be larger than film thickness Hb of dielectric film 6 in the region where resonators 2, 4, 5, 8, 9, and 10 are formed by 0.02λ or more. This structure may reduce the temperature coefficient of frequency of first series resonator 3 by approximately 4 ppm/° C. or more as compared to those of the other resonators.

The above description shows that the film thickness of dielectric film 6 in the region where first series resonator 3 is formed is larger than that in the region where other series resonators 2, 4, and 5, and parallel resonators 8, 9, and 10 are formed. In another implementation, the dielectric film 6 in the region where first series resonator 3 and series resonator 5 with the next highest resonance frequency are formed may be thicker than that in the region where other series resonators 2 and 4, and parallel resonators 8, 9, and 10 are formed. In another implementation, the dielectric film 6 in the region where second series resonator 4 with the highest resonance frequency among the series resonators is formed may be thinner than that in the region where other series resonators 2, 3, and 5 and parallel resonators 8, 9, and 10 are formed. In yet another implementation, no dielectric film 6 may be formed in the region where second series resonator 4 with the highest resonance frequency among the series resonators is formed. To this end, the film thickness of the dielectric film 6 in this region may be zero.

The above structure may make the temperature coefficient of frequency of the characteristics of first series resonator 3 lower than that of second series resonator 4. Consequently, even if first series resonator 3 consumes more power, thereby generating more heat than second series resonator 4, frequency fluctuations of the characteristics of first series resonator 3 may be reduced. This may prevent deterioration of the pass characteristics of ladder-type surface acoustic wave filter 1.

Furthermore, first series resonator 3 with the relatively thick portion of dielectric film 6 formed thereon may have an antiresonant frequency lower than that of second series resonator 4 with the relatively thin portion of dielectric film 6 formed thereon. In other words, dielectric film 6 made of silicon oxide in the region where first series resonator 3 with a relatively low antiresonant frequency is formed may have a larger film thickness than that of dielectric film 6 made of silicon oxide in the region where second series resonator 4 with a relatively high antiresonant frequency is formed. The reason for this configuration is described below.

First series resonator 3 may have a relatively low antiresonant frequency. Thus, the electromechanical coupling factor of first series resonator 3 may largely influence steepness around the cutoff frequency at the high-frequency side of the passband of ladder-type surface acoustic wave filter 1. Meanwhile, second series resonator 4 may have a relatively high antiresonant frequency. Thus, the electromechanical coupling factor of second series resonator 4 may influence the steepness around the cutoff frequency at the high-frequency side of the passband of ladder-type surface acoustic wave filter 1 to a limited degree. Here, a larger film thickness of dielectric film 6 made of silicon oxide attached to a resonator makes the electromechanical coupling factor of the resonator smaller. The characteristics may be used to (1) control the electromechanical coupling factors of first series resonator 3 and second series resonator 4 and (2) increase steepness around the cutoff frequency at the high-frequency side of the passband of ladder-type surface acoustic wave filter 1 while reducing loss in the passband.

That is, making first series resonator 3 with a relatively low antiresonant frequency to have a relatively small electromechanical coupling factor may increase steepness around the cutoff frequency at the high-frequency side of the passband of ladder-type surface acoustic wave filter 1. Moreover, making second series resonator 4 with a relatively high antiresonant frequency to have a large electromechanical coupling factor may increase the passband width of filter 1, thereby reducing loss over a wide passband. Such structure may increase steepness around the cutoff frequency at the high-frequency side of the passband of ladder-type surface acoustic wave filter 1 while reducing loss in the passband.

Meanwhile, first series resonator 3 may have a capacitance larger than that of second series resonator 4. As described above, first series resonator 3 may consume more power than second series resonator 4 around the cutoff frequency at the high-frequency side of the passband of ladder-type surface acoustic wave filter 1. Thus, first series resonator 3 may be more likely to deteriorate due to heat generation than second series resonator 4. Hence, making first series resonator 3 to have a capacitance larger than second series resonator 4 may increase power durability of ladder-type surface acoustic wave filter 1.

The capacitance of a resonator may be proportional to the product of the interdigitating width of IDT electrode fingers and the number of IDT electrode fingers. To make the capacitance of first series resonator 3 higher than that of second series resonator 4, the number of IDT electrode fingers of first series resonator 3 may be larger than that of second series resonator 4. Because more IDT electrode fingers of first series resonator 3 may make electric resistance of first series resonator 3 lower, this may reduce heat generated by first series resonator 3, which in turn may increase power durability of ladder-type surface acoustic wave filter 1.

The first series resonator may be a series resonator at the second or the subsequent stage, like series resonator 2 in this embodiment, which is not connected directly to input terminal 11 of the ladder-type surface acoustic wave filter. In a ladder-type surface acoustic wave filter, a resonator at the input stage may be applied with the maximum power, followed by a lower power at a further subsequent stage. On the other hand, each resonator of a ladder-type surface acoustic wave filter may consume power proportional to the applied power. As described above, first series resonator 3 may consume more power than the other series resonators around the cutoff frequency at the high-frequency side of the passband of ladder-type surface acoustic wave filter 1. Thus, resonator 3 may be more likely to deteriorate due to heat generation than the other resonators. Hence, placing first series resonator 3 at the second or the subsequent stage from input terminal 11 may reduce power consumption in first series resonator 3, which may increase power durability of ladder-type surface acoustic wave filter 1.

The ladder-type surface acoustic wave filter 1 may include four series resonators and three parallel resonators as described above. However, the ladder-type surface acoustic wave filter 1 is not limited to such configuration and may have more or less than four series resonators and more or less than three parallel resonators. It may be adequate that the ladder-type surface acoustic wave filter has at least series resonators with different resonance frequencies.

Figure 7:
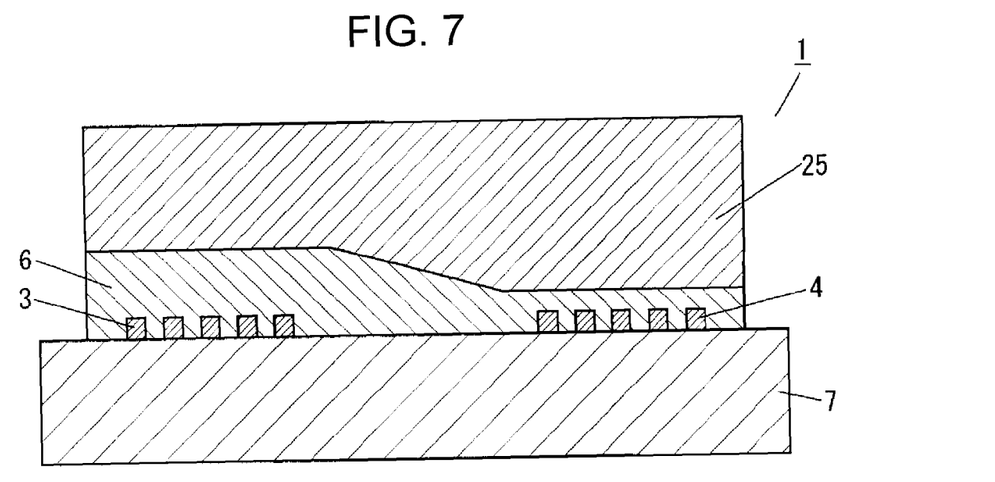
FIG. 7 is a schematic sectional view of the same filter.

The ladder-type surface acoustic wave filter 1 may be a surface acoustic wave filter in one implementation. However, other implementations are contemplated. For example, as shown in FIG. 7, the filter may be a boundary surface acoustic wave filter further including second dielectric film 25 (e.g. SiN film, AlN film) made of a medium with a film thickness between wavelength $\lambda$ and $5\lambda$, inclusive, through which a transverse wave passes with a sound velocity lower than that of the main acoustic wave.

Second Exemplary Embodiment

Hereinafter, a ladder-type surface acoustic wave filter according to the second exemplary embodiment of the present disclosure is described with reference to the related drawings. The configuration is the same as that of the first embodiment unless particularly described.

Figure 8:
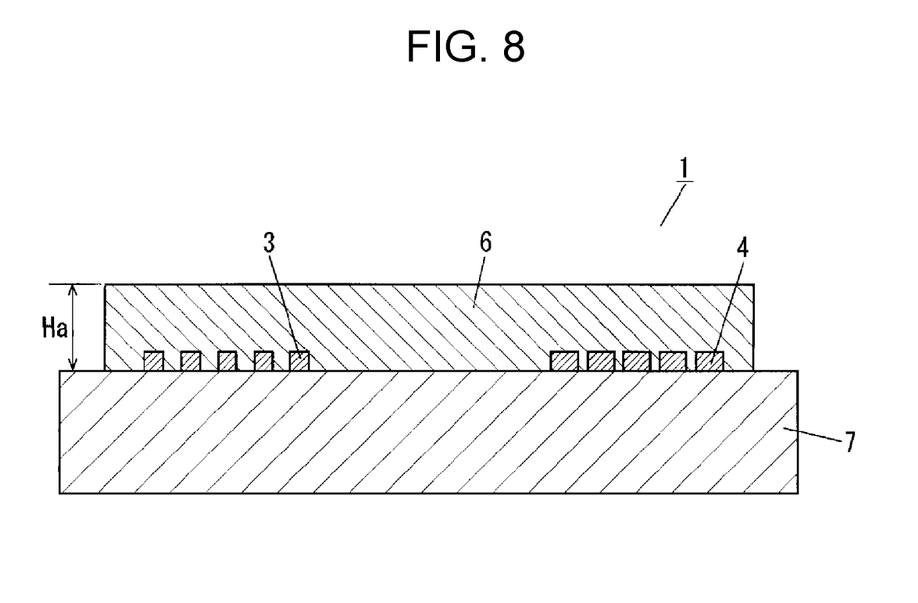
FIG. 8 is a schematic sectional view of a ladder-type surface acoustic wave filter according to the second exemplary embodiment of the present disclosure.

FIG. 8 is a schematic sectional view of a ladder-type surface acoustic wave filter according to the second embodiment. In more detail, FIG. 8 is a schematic sectional view of ladder-type surface acoustic wave filter 1 including first series resonator 3 having the lowest resonance frequency among series resonators 2-5; and second series resonator 4 having a resonance frequency higher than that of first series resonator 3.

In the second embodiment, the film thickness of dielectric film 6 in the region where first series resonator 3 is formed is equal to that in the region where second series resonator 4 is formed, and the duty (electrode width/pitch) of first series resonator 3 is smaller than that of second series resonator 4.

The ladder-type surface acoustic wave filter 1 of the second embodiment includes piezoelectric substrate 7, series resonators formed on piezoelectric substrate 7 and connected between the input and output terminals; at least one parallel resonator formed on piezoelectric substrate 7 and connected between the series resonators and the ground terminal; and dielectric film 6 attached to at least one of the series resonators and having inverse temperature coefficient of frequency to that of piezoelectric substrate 7. The series resonators include first series resonator 3 having the lowest resonance frequency among the series resonators and second series resonator 4 having a resonance frequency higher than that of resonator 3. The duty (electrode width/pitch) of first series resonator 3 is smaller than that of second series resonator 4. Here, it may be adequate that first series resonator 3 having the lowest resonance frequency among the series resonators has a duty (electrode width/pitch) smaller than at least one of other series resonators 2, 4, and 5.

With the duty of a resonator decreasing, the energy distribution of the main acoustic wave may move from piezoelectric substrate 7 to dielectric film 6, which may lower temperature coefficient of frequency of the characteristics of the resonator. That is, the above configuration may make temperature coefficient of frequency of the characteristics of first series resonator 3 lower than that of second series resonator 4. Consequently, even if first series resonator 3 consumes more power, thereby generating more heat than second series resonator 4, frequency fluctuations of the characteristics of resonator 3 may be reduced. This may prevent deterioration of the pass characteristics of ladder-type surface acoustic wave filter 1.

The first series resonator 3 may have a capacitance larger than second series resonator 4. As described above, first series resonator 3 may consume more power than second series resonator 4 around the cutoff frequency at the high-frequency side of the passband of ladder-type surface acoustic wave filter 1. Thus, first series resonator 3 may be more likely to deteriorate due to heat generation than second series resonator 4. Hence, making first series resonator 3 to have larger capacitance than second series resonator 4 may increase power durability of ladder-type surface acoustic wave filter 1.

Here, the capacitance of a resonator is proportional to the product of the interdigitating width of IDT electrode fingers and the number of IDT electrode fingers. To make the capacitance of first series resonator 3 larger than second series resonator 4, the number of IDT electrode fingers of first series resonator 3 may be larger than second series resonator 4. Because more IDT electrode fingers of resonator 3 may make electric resistance of first series resonator 3 lower, this may reduce heat generated by first series resonator 3, which in turn may increase power durability of ladder-type surface acoustic wave filter 1.

The first series resonator is a series resonator at the second or the subsequent stage, such as series resonator 2 in this embodiment, which is not connected directly to input terminal 11 of the ladder-type surface acoustic wave filter. In a ladder-type surface acoustic wave filter, a resonator at the input stage may be applied with the maximum power, followed by a lower power at a further subsequent stage. On the other hand, each resonator of a ladder-type surface acoustic wave filter may consume power proportional to the applied power. As described above, first series resonator 3 may consume more power than the other resonators around the cutoff frequency at the high-frequency side of the passband of ladder-type surface acoustic wave filter 1. Thus, first series resonator 3 may be more likely to deteriorate due to heat generation than the other resonators. Hence, disposing the first series resonator at the second or the subsequent stage may reduce power consumption in first series resonator 3, which may increase power durability of ladder-type surface acoustic wave filter 1.

First series resonator 3 with a duty smaller than that of the other series resonators may have power durability lower than the other series resonators. Accordingly, from the aspect of increasing power durability of ladder-type surface acoustic wave filter 1, first series resonator 3 may be placed at a series arm (at the position of series resonator 4 or 5) closer to output terminal 12 than to input terminal 11. Alternatively, first series resonator 3 may be placed at the series arm (at the position of series resonator 5) closest to output terminal 12. Such configuration may increases power durability of ladder-type surface acoustic wave filter 1.

Other implementations are contemplated. For example, in another implementation, the ladder-type surface acoustic wave filter may include a plurality of series resonators formed on the piezoelectric substrate and connected between the input terminal and the output terminal; at least one parallel resonator formed on the piezoelectric substrate and connected between the series resonators and the ground terminal. The plurality of series resonators may include a first series resonator having a lowest resonance frequency among the series resonators, and a second series resonator having a resonance frequency higher than the first series resonator. A temperature coefficient of frequency of a characteristics of the first series resonator is smaller than that of the second series resonator. To this end, the ladder-type surface acoustic wave filter includes a first dielectric film on the first series resonator, and a second dielectric film on the series resonator. A material of the first dielectric film differs from a material of the second dielectric film to make a temperature coefficient of frequency of a characteristics of the first series resonator smaller than that of the second series resonator. Other implementations are contemplated.

Third Exemplary Embodiment

Hereinafter, the third exemplary embodiment of the present disclosure is described with reference to the related drawings. The configuration is the same as that of the first embodiment unless particularly described.

The third embodiment relates to a duplexer including ladder-type surface acoustic wave filter 1 of the first embodiment as a transmit filter.

Figure 9:
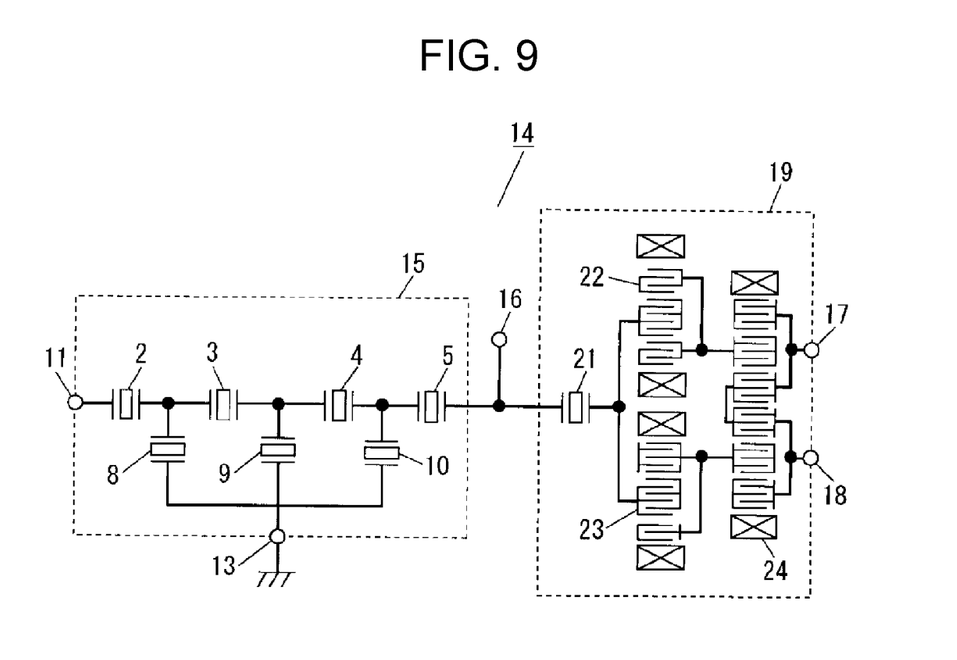
FIG. 9 is a circuit block diagram of a duplexer according to the third exemplary embodiment of the present disclosure.

FIG. 9 is a circuit block diagram of duplexer 14 for Band 2 defined by the 3rd Generation Partnership Project (3GPP). Duplexer 14 includes transmit filter 15 and receive filter 19. The transmit filter 15 is connected between input terminal 11 and antenna terminal 16 (output terminal 12 in the first embodiment) and has a passband of the first frequency band (1.85 GHz to 1.91 GHz). The receive filter 19 is connected between antenna terminal 16 and output terminals 17 and 18 and has a passband of the second frequency band (1.93 GHz to 1.99 GHz), which is higher than the first frequency band. In one implementation, as shown, receive filter 19 includes resonator 21, two double-mode SAW filters 22 and 23 cascade-connected to resonator 21, and double-mode SAW filter 24 cascade-connected to filters 22 and 23, which are disposed in this order from the input side.

The transmit filter 15 of duplexer 14 may require to have both low loss over a wide band and high steepness around the cutoff frequency at the crossband side (at the high-frequency side of the passband). The antiresonant frequency of first series resonator 3 with a relatively large film thickness of dielectric film 6 attached thereto may be made lower than that of second series resonator 4 with a relatively small film thickness, This may result in both higher steepness around the cutoff frequency at the crossband side and lower loss in the passband. In other words, the film thickness of dielectric film 6 made of silicon oxide in the region where first series resonator 3 with a relatively low antiresonant frequency is formed may be made larger than that in the region where second series resonator 4 with a relatively high antiresonant frequency is formed, thus providing the above advantages.

First series resonator 3 may have a relatively low antiresonant frequency. Thus, the electromechanical coupling factor of first series resonator 3 may influence steepness around the cutoff frequency at the crossband side to a large degree. On the other hand, second series resonator 4 may have a relatively high antiresonant frequency. Thus, the electromechanical coupling factor of second series resonator 4 may influence the steepness to a limited degree. Here, a larger film thickness of dielectric film 6 made of silicon oxide attached to a resonator may make the electromechanical coupling factor of the resonator smaller. The characteristics are used to control the electromechanical coupling factors of first series resonator 3 and second series resonator 4 so as to increase steepness around the cutoff frequency at the crossband side while reducing loss in the passband.

That is, making first series resonator 3 with a relatively low antiresonant frequency to have a relatively small electromechanical coupling factor may increase steepness around the cutoff frequency at the crossband side. Meanwhile, making second series resonator 4 with a relatively high antiresonant frequency to have a large electromechanical coupling factor may increase the passband width of transmit filter 15, thereby reducing loss over a wide passband. That is, the structure may increase steepness around the cutoff frequency at the crossband side while reducing loss in the passband.

A ladder-type surface acoustic wave filter and a duplexer including the filter advantageously prevent deterioration of the pass characteristics of the filter and are applicable to an electronic device such as a mobile phone.

Other implementations are contemplated.

What is claimed is:

1. A ladder-type surface acoustic wave filter assembly comprising:
    a substrate for receiving a plurality of components;
    an input terminal, an output terminal, and a ground terminal;
    a plurality of series resonators formed on the substrate and connected between the input terminal and the output terminal, the plurality of series resonators including a first series resonator and a second series resonator, the first series resonator having a lowest resonance frequency among the plurality of series resonators;
    a parallel resonator formed on the substrate and connected between the plurality of series resonators and the ground terminal; and
    a dielectric film coupled to and covering electrode fingers of each series resonator of the ladder-type surface acoustic wave filter assembly and having an inverse temperature coefficient of frequency to that of the substrate, a film thickness of the dielectric film in a region where the second series resonator is formed being smaller than a film thickness of the dielectric film in a region where the first series resonator is formed.

2. The ladder-type surface acoustic wave filter assembly of claim 1 wherein the dielectric film includes silicon oxide.

3. The ladder-type surface acoustic wave filter assembly of claim 1 wherein an antiresonant frequency of the first series resonator is lower than an antiresonant frequency of the second series resonator.

4. A duplexer comprising:
    the ladder-type surface acoustic wave filter assembly of claim 3; and
    a second filter assembly having a passband higher than a passband of the ladder-type surface acoustic wave filter assembly.

5. The duplexer of claim 4 wherein the ladder-type surface acoustic wave filter assembly comprises a transmit filter of the duplexer.

6. The ladder-type surface acoustic wave filter assembly of claim 1 wherein a capacitance of the first series resonator is larger than a capacitance of the second series resonator.

7. The ladder-type surface acoustic wave filter assembly of claim 1 wherein the first series resonator has more interdigital transducer electrode fingers than the second series resonator.

8. The ladder-type surface acoustic wave filter assembly of claim 1 wherein the first series resonator is separated from the input terminal by at least one series resonator of the plurality of series resonators.

9. The ladder-type surface acoustic wave filter assembly of claim 1 wherein the film thickness of the dielectric film in the region where the first series resonator is formed is larger than the film thickness of the dielectric film in other regions on the substrate.

10. The ladder-type surface acoustic wave filter assembly of claim 9 wherein the first series resonator is disposed closer to the output terminal than to the input terminal.

11. The ladder-type surface acoustic wave filter assembly of claim 9 wherein the first series resonator is disposed closest to the output terminal among the plurality of series resonators.

12. The ladder-type surface acoustic wave filter assembly of claim 9 wherein the first series resonator has a smallest duty among the plurality of series resonators.

13. The ladder-type surface acoustic wave filter assembly of claim 1 wherein the substrate includes a piezoelectric substrate.

14. The ladder-type surface acoustic wave filter assembly of claim 1 wherein top surfaces of IDT electrode fingers of the second series resonator are exposed from the dielectric film.

15. The ladder-type surface acoustic wave filter assembly of claim 1 wherein a top surface of the dielectric film above IDT electrode fingers of the first series resonator and a top surface of the dielectric film above IDT electrode fingers of the second series resonator includes projections.

16. The ladder-type surface acoustic wave filter assembly of claim 1 further comprising a second dielectric film disposed on an upper surface of the dielectric film.

17. A ladder-type surface acoustic wave filter assembly comprising:
    a substrate for receiving a plurality of components;
    an input terminal, an output terminal, and a ground terminal;
    a plurality of series resonators formed on the substrate and connected between the input terminal and the output terminal, the plurality of series resonators including a first series resonator and a second series resonator, the first series resonator having a lowest resonance frequency among the plurality of series resonators, a duty of the first series resonator being smaller than a duty of the second series resonator;
    a parallel resonator formed on the substrate and connected between the plurality of series resonators and the ground terminal; and
    a dielectric film coupled to the series resonators and having an inverse temperature coefficient of frequency to that of the substrate.

18. The ladder-type surface acoustic wave filter assembly of claim 17 wherein a capacitance of the first series resonator is larger than a capacitance of the second series resonator.

19. The ladder-type surface acoustic wave filter assembly of claim 17 wherein an antiresonant frequency of the first series resonator is lower than an antiresonant frequency of the second series resonator.

20. The ladder-type surface acoustic wave filter assembly of claim 17 wherein the first series resonator is separated from the input terminal by at least one series resonator of the plurality of series resonators.

21. The ladder-type surface acoustic wave filter assembly of claim 17 wherein the substrate includes a piezoelectric substrate.

22. A ladder-type surface acoustic wave filter assembly comprising:
    a substrate for receiving a plurality of components;
    an input terminal, an output terminal, and a ground terminal;
    a plurality of series resonators formed on the substrate and connected between the input terminal and the output terminal, the plurality of series resonators including each series resonator of the ladder-type surface acoustic wave filter assembly, the plurality of series resonators including a first series resonator and a second series resonator, the first series resonator having a lowest resonance frequency among the plurality of series resonators, a temperature coefficient of frequency of characteristics of the first series resonator being closer to zero than that of the second series resonator;
    a dielectric film coupled to and covering electrode fingers of each of the plurality of series resonators and having an inverse temperature coefficient of frequency to that of the substrate, a film thickness of the dielectric film in a region where the second series resonator is formed being smaller than a film thickness of the dielectric film in a region where the first series resonator is formed; and a parallel resonator formed on the substrate and connected between the plurality of series resonators and the ground terminal.

23. The ladder-type surface acoustic wave filter assembly of claim 22 wherein the substrate includes a piezoelectric substrate.

\* \* \* \* \*